United States Patent [19]

Rast, Jr. et al.

[11] 4,075,512

[45] Jan. 21, 1978

[54] LIGHT PIPE TECHNIQUE FOR GRID PULSING

[75] Inventors: Gustaf J. Rast, Jr.; Thomas A. Barley, both of Huntsville, Ala.

[73] Assignee: The United States of America as represented by the Secretary of the Army, Washington, D.C.

[21] Appl. No.: 546,969

[22] Filed: Feb. 4, 1975

[51] Int. Cl.² .......................................... H03K 17/00
[52] U.S. Cl. .................................. 307/311; 250/227; 307/253
[58] Field of Search .......................... 250/227; 350/96; 307/311, 253; 340/380

[56] References Cited

U.S. PATENT DOCUMENTS

| | | | |
|---|---|---|---|
| 3,732,425 | 5/1973 | Ellert et al. | 250/227 |
| 3,809,908 | 5/1974 | Clanton | 250/227 |
| 3,826,930 | 7/1974 | Perry | 307/311 |

*Primary Examiner*—Stanley D. Miller, Jr.
*Assistant Examiner*—B. P. Davis
*Attorney, Agent, or Firm*—Nathan Edelberg; Robert P. Gibson; Robert C. Sims

[57] ABSTRACT

A light pipe is used between the ground voltage and the extremely high voltage end of a system whereby a pulse can be transmitted from the ground potential end to the high voltage end with safety and without distortion.

1 Claim, 4 Drawing Figures

LIGHT PIPE TECHNIQUE FOR GRID PULSING

SUMMARY OF THE INVENTION

A technique utilizing an optical light pipe is disclosed which improves the operation of a grid pulsing chain for a Traveling Wave Tube Amplifier (TWTA) designed for pulsed operation. An existing Cober Electronics Model 502 Grid Pulser has been modified to incorporate this light pipe with significant improvement in grid pulser operation.

The light pipe element consists of a cylindrical optically transparent rod which is pulsed with a light source, in this case a light emitting diode, at ground level potentials. The opposite end of the rod is fitted with a photodetector to receive the light pulses and forward the detected pulses in electrical signal format to appropriate signal processing circuits. The rod is sufficiently long to form a high potential insulator between the two ends. The light pipe of the preferred embodiment operates with the light source at ground potential and the light receiver at a nominal 40 Kilovolts.

In addition to being an excellent insulator, the light pipe has proven to be a superior method of transmitting pulse information between the two mediums. In this case, between ground and 40 Kilovolts. The transmission of pulse data is considerably faster than electromagnetic coupling techniques and the required data is transmitted with high fidelity and reliability.

DESCRIPTION OF THE PREFERRED EMBODIMENT

Figure 1:
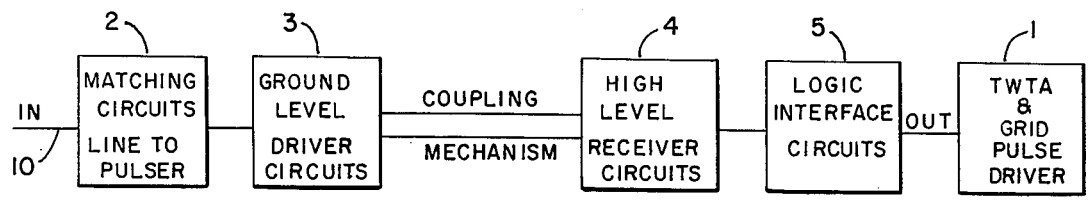
FIG. 1 is a block diagram showing a prior art grid pulse coupling circuit.

FIG. 1 depicts a method commonly utilized to obtain the grid pulse for switching a pulse type traveling wave tube amplifier (TWTA) 1. This grid pulse chain is activated only during an active pulse transfer. In the interim period, the chain acts as a bias arrangement to force the TWTA 1 into the beam current cutoff region. The pulse starting the grid pulsing operation is generated by the PRF timing circuits, not shown. It is then sent to the IN terminal on the grid pulser chain via a transmission line. The most commonly used transmission line is a coaxial cable 10. Transmission of a pulse of this type on a coaxial cable requires good impedance matching circuits 2 to maintain pulse characteristics with acceptable fidelity. An even more difficult task is to transfer this high fidelity pulse through appropriate processing hardware to form the actual pulse which switches the TWTA into the beam conduction state. A big factor in making this pulse transfer difficult is that the pulse is initially generated at ground potential levels by driver 3 but to switch the TWTA it must be transferred to very high potential levels by a coupling mechanism suitable for insulating the two potential levels adequately while allowing the pulse to be received with minimum distortion by reciever 4. The output of reciever 4 is then connected to the TWTA grid circuitry 1 through appropriate logic interface circuits 5.

Figure 2:
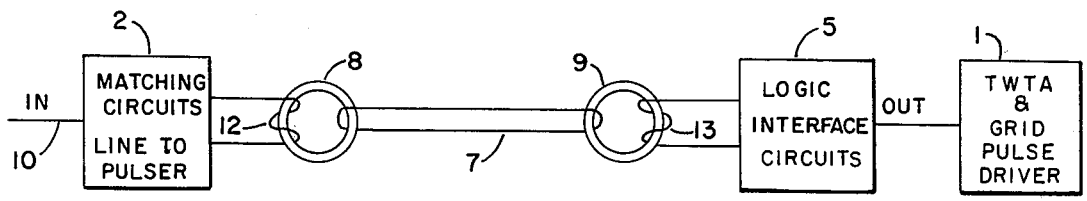
FIG. 2 is a prior art diagram illustrating a wire loop coupling mechanism.

A grid pulser which works in this general way is the COBER ELECTRONICS MODEL 502 GRID PULSER. The 502 is an adequate device for many uses but it does not have good pulse fidelity transfer. The area where the pulse fidelity is destroyed is shown in FIG. 2. The single wire loop 7 coupling the two ferrite cores 8 and 9 is theoretically a good concept for slow rise time pulses. However, impedance matching the coaxial transmission cable 10 to the ferrite core 8 on the ground potential end 12 of the coupling mechanism result in very poor energy transfer and starts a sequence which virtually destroys pulse integrity. After the pulse has traversed wire loop 7 and ferrite core 9 at the high potential end 13 of the coupling mechanism, the pulse fidelity is lost. Various techniques have been considered to correct the limitations of the ferrite core wire loop coupling mechanism but the physical constraints are rather formidable.

Figure 3:
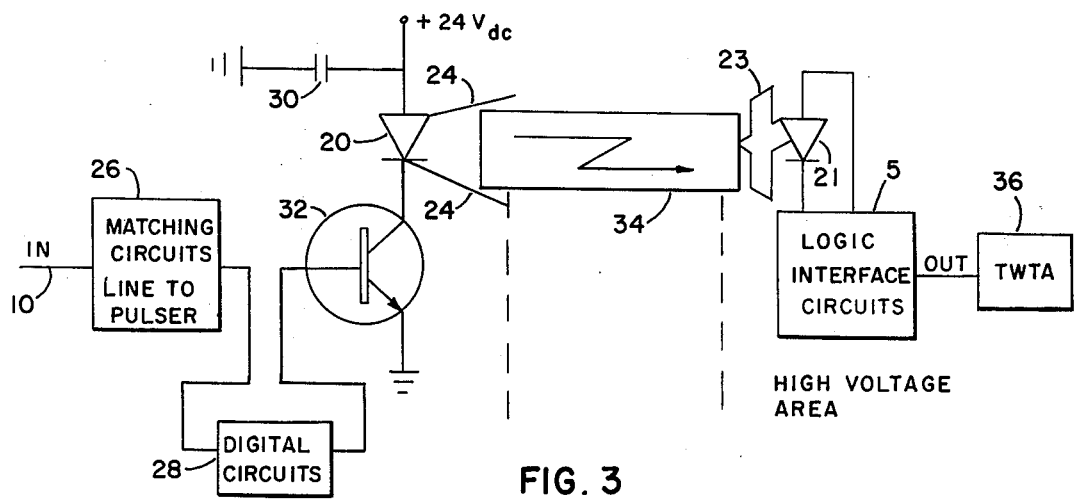
FIG. 3 is a schematic showing of the preferred embodiment of the present invention.
Figure 4:
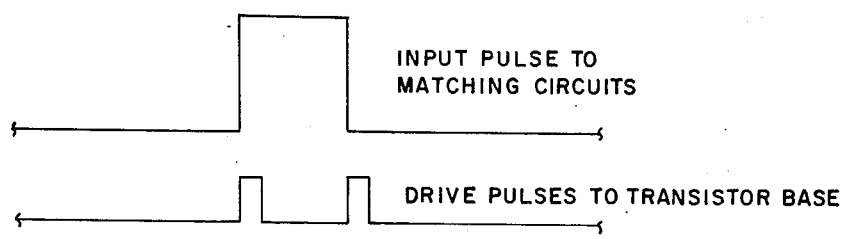
FIG. 4 illustrates waveforms of the pulses of the preferred invention.

In the process of considering alternatives for a coupling mechanism which would maintain pulse fidelity, it became apparent that only portions of the input pulse waveform were important. The entire pulse was not required. The vital information element for the grid pulsing operation are the leading edge and trailing edge of the input pulse. The leading edge and trailing edge can each be synthesized by short pulses as shown in FIG. 4. Pulses of this type are easily handled by light pipes with the proper qualities. Using this information, it was determined that a single light pipe with the proper transmitter and receiver hardware would not only preserve the necessary data but was also considerably faster (less time delay in transferring the pulse) than a transmission line normally used for conveying data. The coupling mechanism shown in FIG. 3 is clear plastic pipe with a light emitting diode (LED) 20 on one end and a photodetector 21 on the other end. This pipe has much better insulating qualities than the insulated wire loop which is another added benefit. A diode coupler 23 and a metal reflector 24 may be provided for better coupling.

Operation of the single light pipe coupler of FIG. 3 can be described as follows:

1. A pulse is received at the input matching circuits 26. This matching permits the pulse to be received without undue distortion.

2. The received pulse is applied to the appropriate digital circuits 28 which synthesize a short pulse representing the leading edge of the input pulse and another short pulse representing the trailing edge of the input pulse. These circuits could be an integrator and a rectifier or any of the known high-pass circuits. This operation changes the wide pulse in FIG. 4 into two short pulses positioned to represent the leading and trailing edges of the wide pulse.

3. In the quiescent state, the 33 microfarad capacitor 30 is charged to a full 24 volts, the LED has no current flow and the transistor 32 is cutoff. When a short pulse is applied to the transistor base, the transistor rapidly switches to a near saturation state. This sudden switching discharges capacitor 30 through the LED 20 and transistor 32 to ground. A discharge of this nature causes the LED to generate a flash of light. At the end of the short pulse, the transistor rapidly switches off, stopping the current flow in the transistor and LED. The capacitor recharges from the 24 volt DC supply and the circuit is setup for another pulse sequence.

4. At the high voltage end of the light pipe 34, in the quiescent state, the TWTA 36 is biased at a DC voltage well beyond cutoff. Thus no current flows in the TWTA beam circuit.

5. Operation at the high potential end of the light pipe starts with the photodetector receiving a light flash. This light flash is then converted to a precisely controlled digital pulse by diode 21.

6. This digital pulse is then used by the logic interface circuits 5 to swith the TWTA 36 into the beam current conduction state by applying appropriate pulsing between the grid and cathode of the TWTA.

7. The TWTA 36 remains in the conduction state until a command from the logic interface circuits 5 cuts the TWTA off in response to the trailing edge pulse from diode 21 or the maximum pulse width protective circuits built into logic interface 5.

8. Under normal operation, the leading edge short pulse starts TWTA operation, and the trailing edge short pulse stops operation. Any pulse width changes on the input pulse are automatically transferred to the TWTA.

9. The operation described above repeats for each pulse.

It should be noted in FIG. 3 that a metal reflector 24 is shown between the LED and the cylindrical rod light pipe 34. This reflector increases light coupling into the optically polished end of the light pipe. The opposite end of this light pipe is also optically polished to improve light coupling into the photodetector.

A limit exists on the minimum pulse width that can be supported by the single light pipe technique. In the particular circuit as implemented a limit of 0.8 microseconds results from the particular transistor 32, the photodiode 20, and the size of the discharge capacitor 30 is selected. Each specific circuit design will have a finite lower operational limit at some pulse width dictated by the particular components implemented. This limit results from the switching times on the transistor and the charging times on the capacitor. A maximum pulse width is unlimited in this technique. The maximum limits would be set as required by the device using the pulse. The limitation on short pulse operation can be removed by using a dual light pipe. The individual light pipe circuit would operate as already described with the exception that a light pipe would be used for each short pulse. That would put the leading edge short pulse down one pipe and the trailing edge short pulse down the other pipe. This technique would allow virtually any pulse width to be coupled through a mechanism such as that already described. The main problem associated with a dual pipe approach would become a pulse rise time problem and not a timing differential between sequential pulses. (Current light pipe technology will readily support rise time and fall times of pulses in the nanosecond range. Since rise time is closely associated with hardware capabilities, it is anticipated that a light pipe of this type can eventually support picosecond or even shorter rise time as hardware capabilities improve.)

The light pipe concept allows pulse transmission through any medium in which the pipe itself can be physically located. Although the application discussed has been oriented to a grid pulser problem, the same techniques can be used for all sorts of applications requiring a variety of interface mediums other than potential difference.

We claim:

1. In a coupling system having a first circuit which has an output signal which is to be coupled to an input of a second circuit the improvement comprising a light pipe connected between said first and second circuits for coupling said signal; light emitting means connected to the output signal of said first circuit so as to emit light in response to the output signal of said first circuit; said light emitting means being located at a first end of said light pipe so as to allow the light emitted to pass through said light pipe to a second end of said light pipe; detector means connected to the second end of said light pipe so as to detect said light and convert it to a signal; the output of said light detecting means being connected to an input of said second circuit; said first and second circuits have a high voltage potential difference between them; said light pipe provides insulation between the circuits; said first circuit is at ground potential; said second circuit is operating at a high voltage with respect to the ground potential; said light emitting means is a light emitting diode; and said detecting means is a photodetector diode; said output signal is an electrical pulse; circuit means connected to said light emitting diode so as to cause said light emitting diode to emit a short light pulse as compared to the length of the pulse of the output signal upon the occurrence of the leading edge of said output signal and a second light pulse upon the occurrence of the trailing edge of said output signal pulse; and said second circuit converting these two light pulses back into one long electrical pulse.

* * * * *